United States Patent
Hong et al.

(10) Patent No.: US 9,627,079 B1
(45) Date of Patent: Apr. 18, 2017

(54) STORAGE DEVICE, MEMORY SYSTEM HAVING THE SAME, AND OPERATING METHOD THEREOF

(71) Applicant: SK hynix Inc., Gyeonggi-do (KR)

(72) Inventors: Yong Hwan Hong, Gyeonggi-do (KR); Byung Ryul Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/093,935

(22) Filed: Apr. 8, 2016

(30) Foreign Application Priority Data

Oct. 30, 2015 (KR) .......................... 10-2015-0152357

(51) Int. Cl.
*G11C 11/34* (2006.01)
*G11C 16/16* (2006.01)
*G11C 16/08* (2006.01)
*G11C 16/10* (2006.01)

(52) U.S. Cl.
CPC .............. *G11C 16/16* (2013.01); *G11C 16/08* (2013.01); *G11C 16/10* (2013.01)

(58) Field of Classification Search
CPC ...... G11C 16/16; G11C 16/14; G11C 16/3445
USPC ................ 365/185.29, 185.18, 185.22
See application file for complete search history.

(56) References Cited

U.S. PATENT DOCUMENTS 7,110,301 B2 * 9/2006 Lee .................... G11C 16/16
365/185.11
2013/0141971 A1 * 6/2013 Hosono ............... G11C 11/5628
365/185.02

FOREIGN PATENT DOCUMENTS

KR      1020080084180       9/2008

* cited by examiner

*Primary Examiner* — Son Dinh
(74) *Attorney, Agent, or Firm* — IP & T Group LLP

(57) ABSTRACT

There are provided a storage device, a memory system having the same, and an operating method thereof. A storage device includes a plurality of memory blocks for storing data, a peripheral circuit for selecting multiple memory blocks from among the plurality of memory blocks and simultaneously performing an erase operation on the multiple memory blocks, and a control circuit for controlling the peripheral circuit so that the multiple memory blocks are simultaneously erased, and an erase operation and an erase verification operation of a selected memory block from among the multiple memory bocks are performed.

20 Claims, 10 Drawing Sheets

STORAGE DEVICE, MEMORY SYSTEM HAVING THE SAME, AND OPERATING METHOD THEREOF

CROSS-REFERENCE TO RELATED APPLICATION

The present application claims a priority to a Korean patent application number 10-2015-0152357 filed, on Oct. 30, 2015, which is incorporated herein in its entirety by reference.

BACKGROUND

1. Field

The present disclosure generally relates to a storage device, a memory system having the same, and an operating method thereof.

2. Description of the Related Art

A storage device such as a NAND flash memory device is characterized in that data is retained even when the power supply to the device is cut off. Hence, a NAND flash memory device is frequently used in a portable electronic device such as a notebook computer, a cellular phone, and a smart phone.

Demand for portable electronic devices continues to increase, however, newer portable electronic devices are required to process large amounts of data. Hence, data storage devices having a faster data processing speed are needed.

SUMMARY

Embodiments provide a storage device, a memory system having the same, and an operating method thereof, which can perform a mufti-erase operation.

According to an aspect of the present disclosure, there is provided a storage device including: a plurality of memory blocks suitable for storing data; a peripheral circuit suitable for selecting multiple memory blocks from among the plurality of memory blocks and for performing simultaneously an erase operation on the selected multiple memory blocks; and a control circuit suitable for controlling the peripheral circuit so that the multiple memory blocks are erased simultaneously, and an erase operation and an erase verification operation of a selected memory block from among the multiple memory books are performed.

According to an aspect of the present disclosure, there is provided a memory system including: a memory device suitable for including storage devices for performing a multi-erase operation; and a memory controller suitable for controlling the memory device in response to a command received from a host.

According to an aspect of the present disclosure, there is provided a method of operating a storage device, the method including: performing a multi-erase section where an erase loop is repeated so that multiple memory blocks selected from among a plurality of memory blocks are simultaneously erased; and if a frequency of the erase loop reaches a maximum multi-loop frequency, performing a single erase section so that the multiple memory blocks are subjected one by one to an erase operation and an erase verification operation.

DETAILED DESCRIPTION

Figure 1:
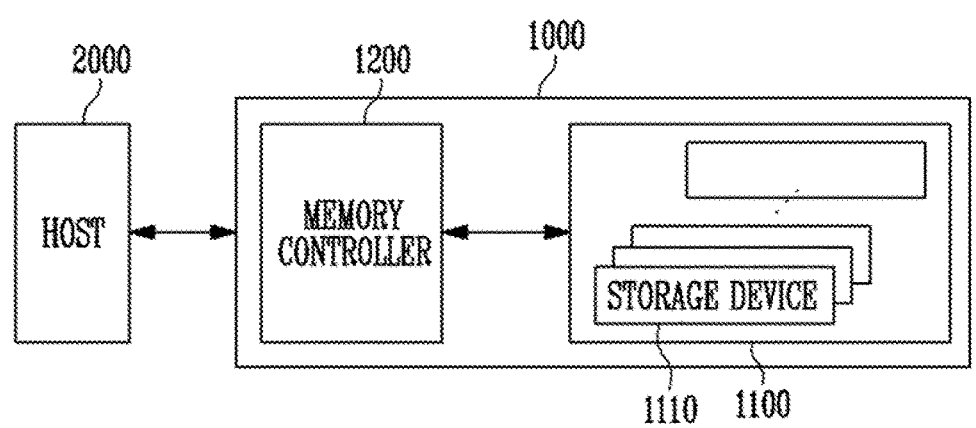
FIG. 1 is a diagram illustrating a memory system, according to an embodiment of the present disclosure.

Example embodiments will now be described more fully hereinafter with reference to the accompanying drawings; however, it is noted that the invention may be embodied in different forms and should not be construed as being limited to the embodiments set forth herein. Rather, these embodiments are provided so that this disclosure will be thorough and complete, and will fully convey the invention to those skilled in the art to which the invention pertains.

In the figures, dimensions may be exaggerated for clarity of illustration. Moreover it will be understood that when an element is referred to as being "between" two elements it can be the only element between the two elements, or one or more intervening elements may also be present. Furthermore, like reference numerals refer to like elements throughout.

Referring to FIG. 1 a memory system is provided according to an embodiment of the present disclosure. Referring to FIG. 1, the memory system 1000 may include a memory device 1100 for storing data and a memory controller 1200 for controlling the memory device 1100.

The memory device 1100 may include a plurality of storage devices 1110. The storage devices 1110 may include a double data rate synchronous dynamic random access memory (DDR SDRAM), a low power double data rate 4 (LPDDR4) SDRAM, a graphics double data rate (GDDR) SRAM, a low power DDR (LPDDR), a rambus dynamic random access memory (RDRAM), a flash memory and/or the like. Each of the storage devices 1110 may be capable of performing a multi-erase operation. In an embodiment, each of the storage devices 1110 may be or comprise a NAND flash memory. Each of the storage devices 1110 being implemented as a NAND flash memory device may be suitable for performing a multi-erase operation.

The memory controller 1200 may control the overall operations of the memory device 1100. For example, the memory controller 1200 may output to the memory device 1100 a command for controlling the memory device 1100, an address, and/or data, in response to a command received from a host 2000. Also, the memory controller 1200 may receive data from the memory device 1100 in response to a command received from a host 2000.

The host 2000 may communicate with the memory system 1000 by using an interface protocol such as, for example, a peripheral component interconnect-express (PCI-E), an advanced technology attachment (ATA), a serial ATA (SATA), a parallel ATA (PATA), or a serial attached SCSI (SAS).

Figure 2:
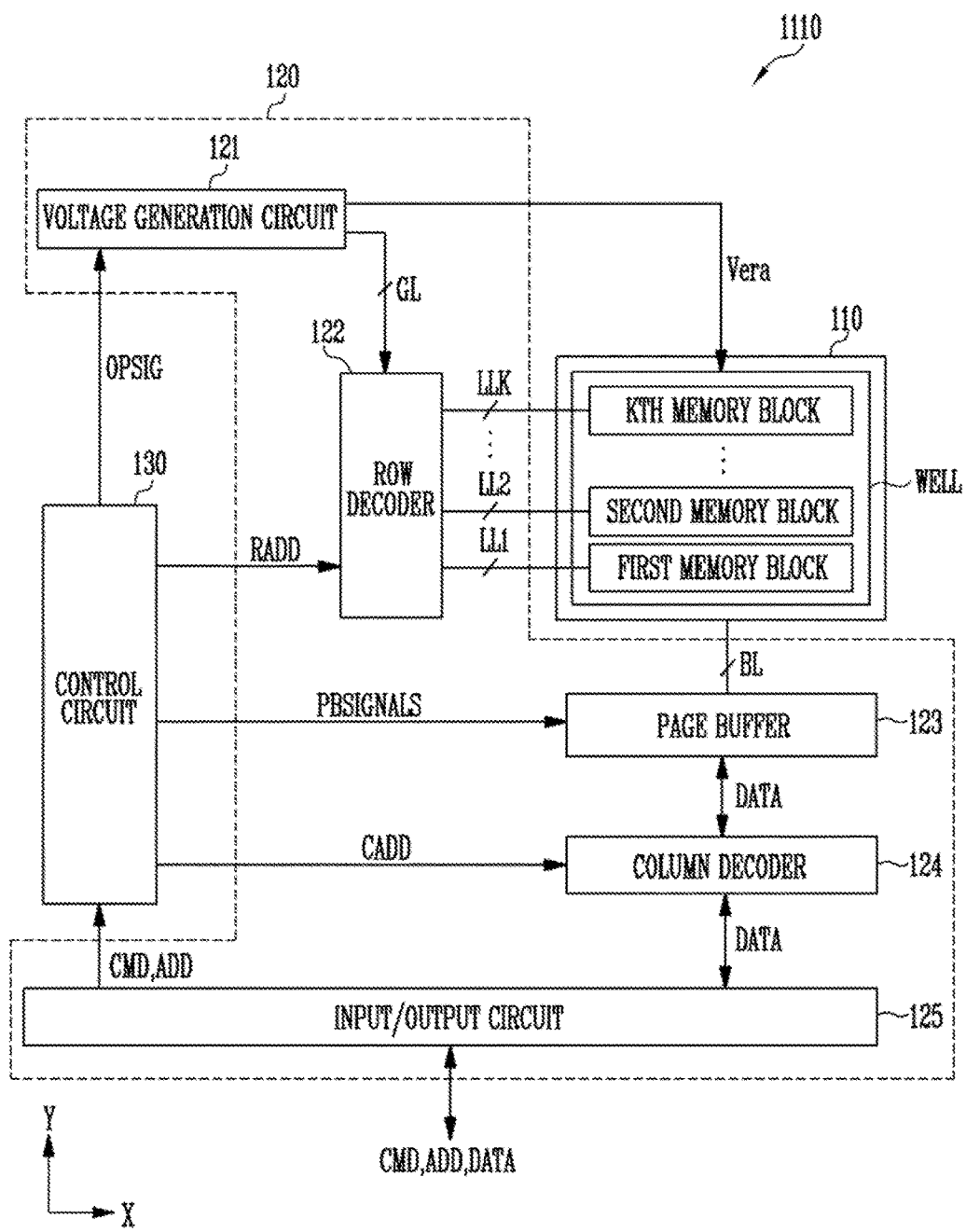
FIG. 2 is a diagram illustrating a storage device, according to an embodiment of the present disclosure.

Referring now to FIG. 2, a storage device, according to an embodiment of the present disclosure is provided. For example, the storage device of FIG. 2 may be employed as one of the storage devices 1110 of FIG. 1. Accordingly, the storage device 1110 may include a memory cell array 110 configured to store data, a peripheral circuit 120 configured to perform an operation such as a program, read, and/or erase operation of the memory cell array 110, and a control circuit 130 configured to control the peripheral circuit 120.

The memory cell array 110 may include a plurality of memory blocks, including first to Kth (K is a positive integer) memory blocks configured identically to each other. The first to Kth memory blocks may share one well. More specifically, a well may be formed in a substrate, and the first to Kth memory blocks may be formed over the well.

The peripheral circuit 120 may include a voltage generation circuit 121, a row decoder 122, a page buffer 123, a column decoder 124, and an input/output circuit 125.

The voltage generation circuit 121 may generate operation one or more voltages having various voltage levels in response to an operation signal OPSIG. For example in an erase operation, the voltage generation circuit 121 may generate operation voltages having various levels such as an erase voltage Vera and a pass voltage in response to an erase operation signal OPSIG. The erase voltage Vera may be applied to the well in the memory cell array 110, and the other operation voltages may be applied to global lines GL, The row decoder 122 may be connected to the voltage generation circuit 121 through one or more global lines GL. The row decoder 122 may be connected to the first to Kth memory blocks through first to Kth local lines LL1 to LLK. The row decoder 122 may select at least one memory block in response to a row address RADD received from the control circuit 130. The row decoder 122 may also provide at least one operation voltage supplied from the voltage generation circuit 121 to the selected at least one memory block.

In an embodiment for a multi-erase operation, the row decoder 122 may select multiple memory blocks simultaneously in response to the row address RADD. Alternatively, the row decoder 122 may select one memory block in response to the row address RADD. While the erase voltage Vera is being applied to the well, the row decoder 122 may provide one or more operation voltages supplied from the voltage generation circuit 121 to local lines connected to the selected at least one memory block, and float local lines connected to the other unselected memory blocks.

The page buffer 123 may be connected to the memory cell array 110 through bit lines BL. The page buffer 123 may precharge the bit lines BL with a positive voltage, transmit data to and/or receive data from a selected memory block in program and read operations. The page buffer 123 may store transmitted data temporarily, in response to a page buffer control signal PBSIGNALS from the control circuit 130.

The column decoder 124 may transmit data to and/or receive data DATA from the page buffer 123. The column decoder 124 may trans it data to and/or receive data DATA from the input/output circuit 125.

The input/output circuit 125 may be configured to transmit, to the control circuit 130, a command CMD and an address ADD, transmitted from an external device e.g., a memory controller. The input/output circuit 125 may be configured to transmit data DATA transmitted from an external device to the column decoder 124, or output data DATA transmitted from the column decoder 124 to the external device.

The control circuit 130 may control the peripheral circuit 120 in response to the command CMD and the address ADD received from the input/output circuit 125. For example, the control circuit 130 may control the peripheral circuit 120 to perform a multi-erase operation including a multi-erase loop and/or a single erase loop.

In an embodiment, when a multi-erase loop is performed, the control circuit 130 may control the peripheral circuit 120 so that multiple memory blocks selected from among the plurality of memory blocks including the first to Kth memory blocks may simultaneously erased. If the number of times of performing the multi-erase loop reaches a maximum number of times of performing the multi-erase loop, the control circuit 130 may control the peripheral circuit 120 to perform the single erase loop for erasing selected memory blocks in a single unit.

To this end, in a multi-erase operation, the control circuit 130 may control the row decoder 122 so that multiple memory blocks can be simultaneously selected. In a single erase operation, the control circuit 130 may control the row decoder 122 so that the multiple memory blocks can be sequentially selected one by one.

Figure 3:
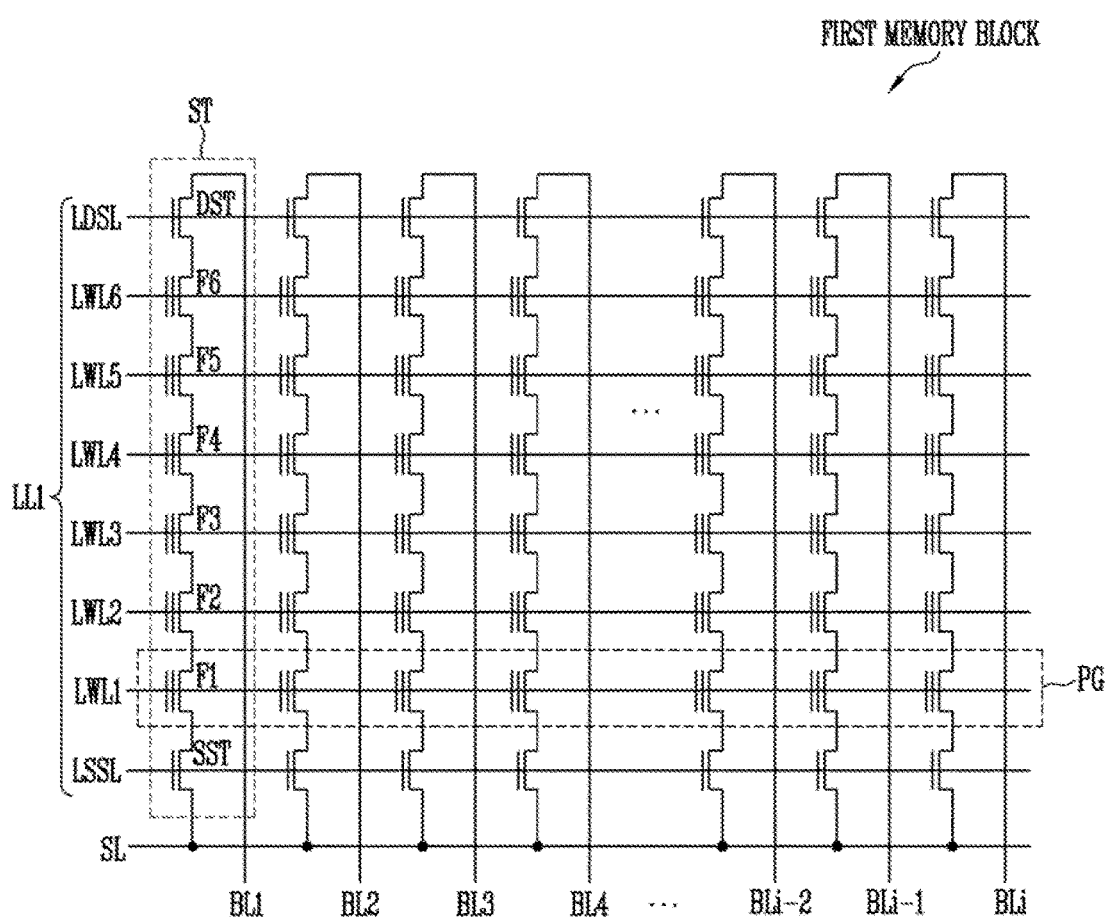
FIG. 3 is a diagram illustrating a memory block, according to an embodiment of the present disclosure.

FIG. 3 is a diagram illustrating a memory block according to an embodiment of the present disclosure. For example, the memory block of FIG. 3 may be the first memory block of the memory cell array 110 in FIG. 1. Since the first to Kth memory blocks shown in FIG. 1 are configured identically to each other, only the first memory block will be described as an example in FIG. 3.

Referring to FIG. 3 the first memory block may include a plurality of cell strings ST connected between a common source line SL and a plurality of respective bit lines BL1 to BLi. Each cell string ST may include a source select transistor SST, memory cells F1 to F6, and a drain select transistors DST, which are connected in series to each other between the source line SL and the bit lines BL1 to BLi. The sources of the source select transistors SST are connected to the common source line SL, and drains of the drain select transistors DST are connected to a plurality of respective the bit lines BL1 to BLi. For convenience of illustration, only six memory cells F1 to F6 are shown in FIG. 3, but a larger number of memory cells may be included in the cell strings ST according to the design of a semiconductor device.

Each of the memory cells F1 to F6 may be configured as a single level cell (SLC) which stores 1 bit of data, or configured as a multi level cell (MLC) which stores two or more bits of data. For example, the MLC may be a triple a two level cell, triple level cell (TLC), or a quadruple level cell (QLC) in which 2, 3, or 4 bits of data are stored may be stored, respectively.

Gates of the source select transistors SST included in different strings are connected to a local source select line LSSL, gates of the memory cells F1 to F6 are connected to local word lines LWL1 to LWL6, and gates of the drain select transistors DST are connected to a local drain select line LDSL. The local source select line LSSL, the local word lines LWL1 to LWL6, and the local drain select line LDSL may be included in first local lines LL1.

Figure 4:
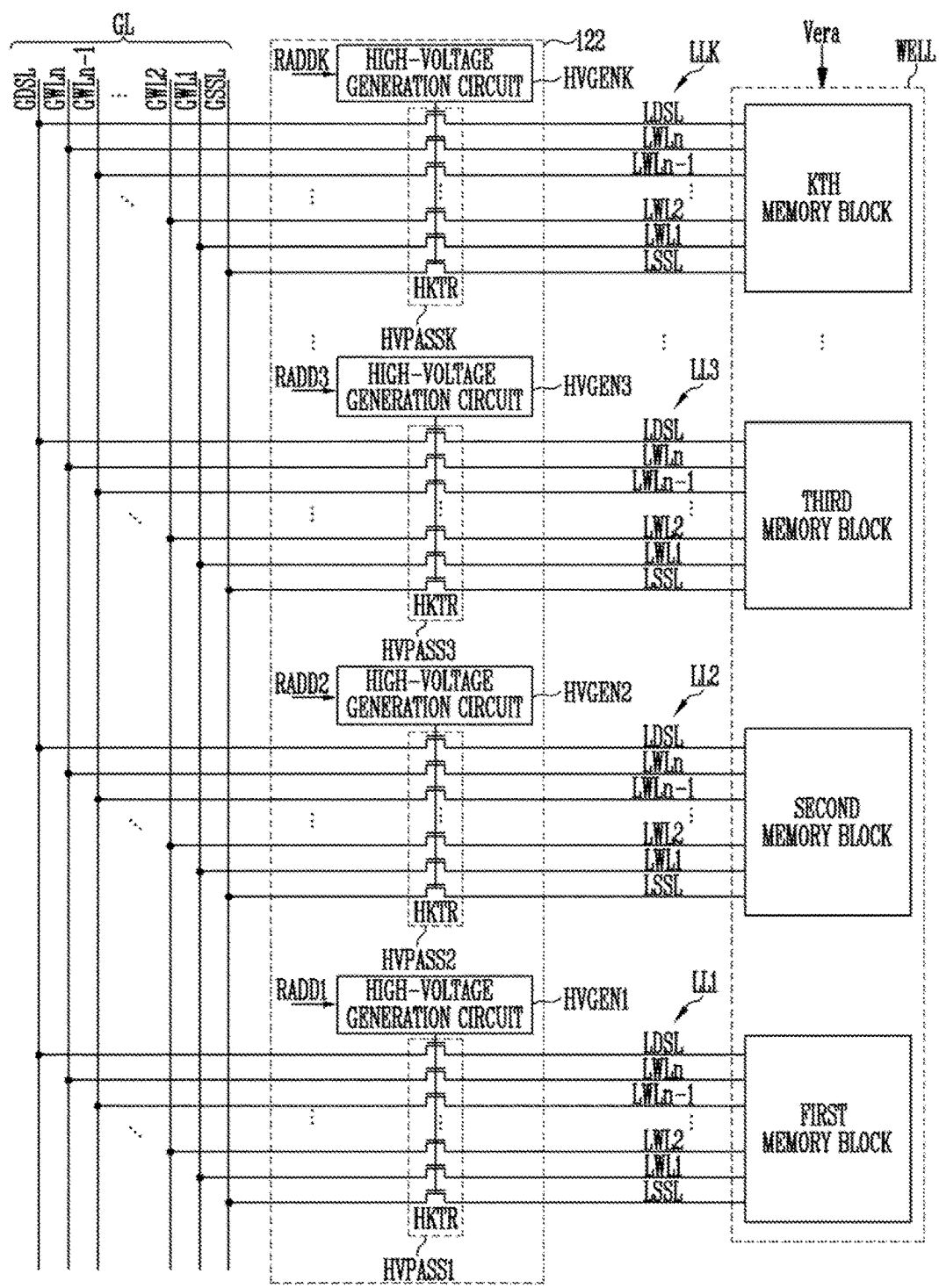
FIG. 4 is a diagram illustrating a connection relationship between a row decoder and memory blocks, according to an embodiment of the present disclosure.

FIG. 4 is a diagram illustrating a connection relationship between the row decoder and the memory blocks, according to an embodiment of the present disclosure. For example, the row decoder and the memory blocks of FIG. 4 may be the row decoder 122 and the memory blocks of the memory cell array 100 in FIG. 2, respectively.

Referring, to FIG. 4, the row decoder 122 may be connected to a plurality of global lines GL and first to Kth local lines LL1 to LLK. The row decoder 122 may selectively connect the plurality of global lines GL to the first to Kth local lines LL1 to LLK in response to row addresses RADD1 to RADDK.

The row decoder 122 may include first to Kth high-voltage generation circuits HVGEN1 to HVGENK and first to Kth pass circuits HVPASS1 to HVPASSK. Each of the number of the first to Kth high-voltage generation circuits HVGEN1 to HVGENK and the number of the first to Kth pass circuits HVPASS1 to HVPASSK may be equal to the number of the memory blocks. For example, if K memory blocks are included in the memory cell array, the row decoder 122 may also include K high-voltage generation circuits and K pass circuits.

The first to Kth pass circuits HVPASS1 to HVPASSK may be connected between the global lines GL and the first: to Kth local lines LL1 to LLK. The global lines GL may be connected to the voltage generation circuit 121 of FIG. 2. Operation voltages generated from the voltage generation circuit 121 may be commonly provided to the first to Kth pass circuits HVPASS1 to HVPASSK through the global lines GL. The global lines GL may include a global source select line GSSL, first to nth global word lines GWL1 to GWLn, and a global drain select line GDSL. The first to Kth local lines LL1 to LLK may be connected between the first to Kth pass circuits HVPASS1 to HVPASSK and the first to Kth memory blocks. Each of the first to Kth local lines LL1 to LLK may include a local source select line LSSL, first to nth local word lines LWL1 to LWLn and a local drain select line LDSL.

Each of the first to Kth pass circuits HVPASS1 to HVPASSK may be connected between the global lines GL and the first to Kth local lines LL1 to LLK, and may include a plurality of high-voltage switches HKTR which operate in response to a high voltage generated from the first to Kth high-voltage generation circuits HVGEN1 to HVGENK. The high-voltage switches HKTR may be implemented as high-voltage transistors. The high-voltage switches HKTR may simultaneously operate in response to a voltage output from the first to Kth high-voltage generation circuits HVGEN1 to HVGENK, respectively. For example, gates of the high-voltage switches HKTR of the first pass circuit HVPASS1 may be commonly connected to an output terminal of the first high-voltage generation circuit HVGEN1. The other second to Kth pass circuits HVPASS2 to HVPASSK may be also configured identically to the first high-voltage generation circuit HVGEN1.

The first to Kth high-voltage generation circuits HVGEN1 to HVGENK may form pairs with the first to Kth pass circuits HVPASS1 to HVPASSK, respectively. The first to Kth high-voltage generation circuits HVGEN1 to HVGENK may generate high voltages in response to first to Kth row addresses RADD1 to RADDK, respectively. For example, only the first and third high-voltage generation circuits HVGEN1 and HVGEN3 may generate a high voltage, and the other second and fourth to Kth high-voltage generation circuits HVGEN2 and HVGEN4 to HVGENK may output 0V. In this case, only the high-voltage switches HKTR included in the first and third high-voltage generation circuits HVGEN1 and HVGEN3, to which the high voltage is applied, are turned on. Therefore, operation voltages may be applied only to the first and third local lines LL1 and LL3, and the other second and fourth to Kth local lines LL2 and LL4 to LLK are floated.

In a multi-erase operation, an erase voltage Vera provided from the voltage generation circuit 121 of FIG. 2 may be applied to the well shared by the first to Kth memory blocks. In this case, some memory blocks among a plurality of memory blocks including the first to Kth memory blocks may be simultaneously erased in response to the first to Kth row addresses RADD1 to RADDK. For example, in the mufti-erase operation, the first to nth global word lines GWL1 to GLWn may be grounded to 0V. In this case, if the first and third high-voltage generation circuits HVGEN1 and HVGEN3 simultaneously generate a high voltage, the high-voltage switches HKTR included in the first and third pass circuits HVPASS1 and HVPASS3 are simultaneously turned on. Therefore, the first to nth local word lines LWL1 to LWLn connected to the first and third memory blocks may also be grounded to 0V. The other local word lines LWL1 to LWLn, the other local source select lines LSSL and the other local drain select lines LDSL may be floated. Thus, the memory cells of the selected first and third memory blocks are erased, and the memory cells of the other unselected second and fourth to Kth memory blocks may not be erased.

Figure 5:
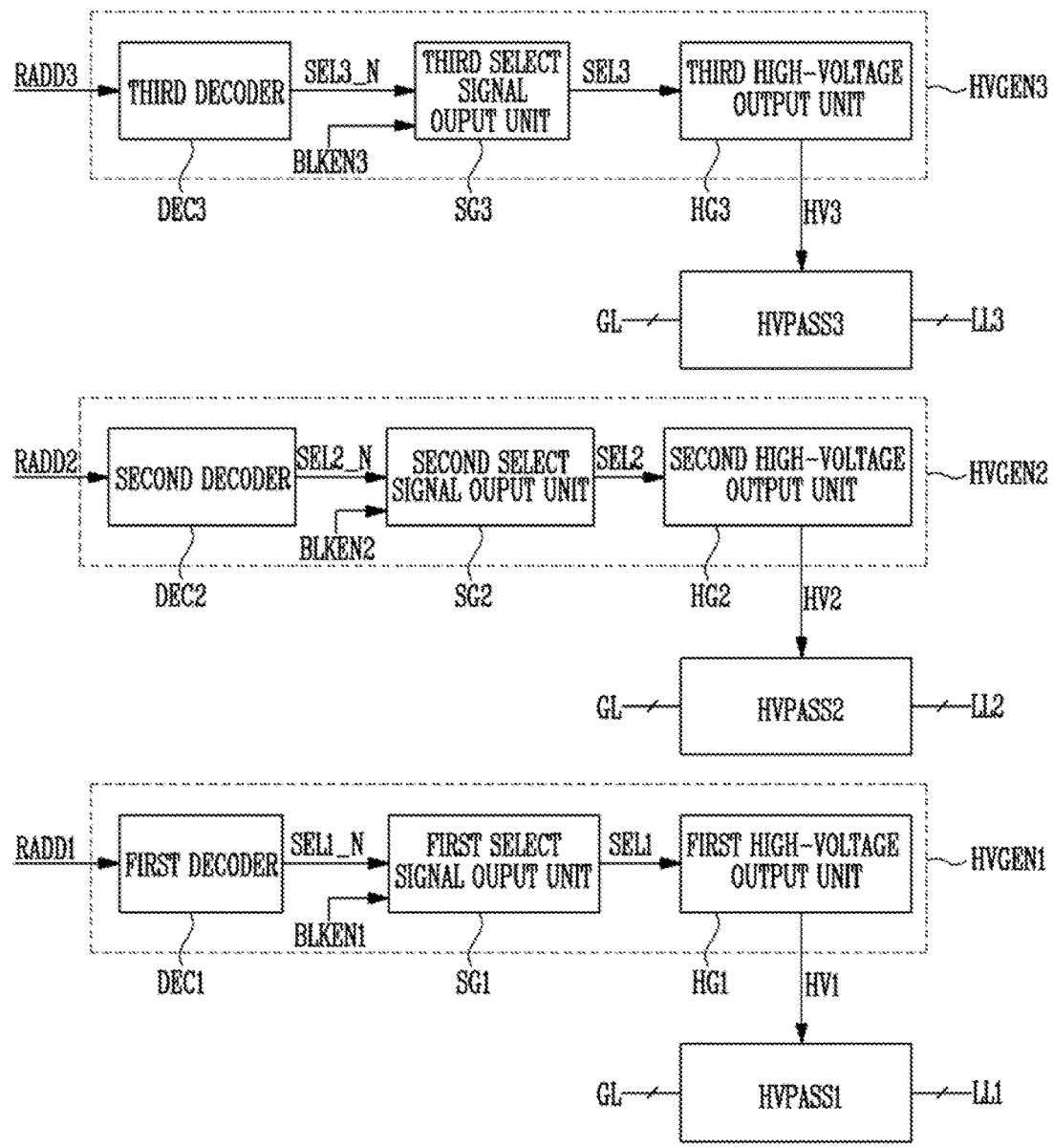
FIG. 5 is a diagram illustrating high-voltage generation circuits, according to an embodiment of the present disclosure.

FIG. 5 is a diagram illustrating high-voltage generation circuits, according to an embodiment of the present disclosure. For example, the high-voltage generation circuits of FIG. 5 may be the high-voltage generation circuits HVGEN1 to HVGEN3 of FIG. 4.

Referring to FIG. 5, the high-voltage generation circuits may be configured identically to one another. For convenience of illustration, the first to third high-voltage generation circuits HVGEN1 to HVGEN3 among the plurality of high-voltage generation circuits will be described as an example.

The first high-voltage generation circuit HVGEN1 may include a first decoder DEC1, a first select signal output unit SG1, and a first high-voltage output unit HG1.

The first decoder DEC1 may output a first pre select signal SEL1_N in response to a first row address RADD1. For example, the first decoder DEC1 may output a high or low first pre select signal SEL1_N by decoding the first row address RADD1.

The first select signal output unit SG1 may output a first select signal SEL1 in response to the first pre select signal SEL1_N and a first multi-enable signal BLKEN1. For example, the first multi-enable signal BLKEN1 may be activated as high when multiple memory blocks are selected. If the first multi-enable signal BLKE1 is maintained as high, the first select signal output unit SG1 may continue to output the previous first select signal SEL1 even though the first pre select signal SEL1_N is changed. That is, if the first multi-enable signal BLKEN1 is high, the value of the previously outputted first select signal SEL1 may be maintained without any change even though the first pre select signal SEL1_N is changed.

The first high-voltage output unit HG1 may output a first high voltage HV1 in response to the first select signal SEL1. If the first high voltage HG1 is output, the first pass circuit HVPASS1 may connect the global lines GL and the first local lines LL1 to each other, and provides to the first local lines LL1 the voltages applied to the global lines GL.

Like the first high-voltage generation circuit HVGEN1 the other second and third high-voltage generation circuits HVGEN2 and HVGEN3 may also include second and third decoders DEC2 and DEC3, second and third select signal output unit SG2 and SG3, and second and third high-voltage output unit HG2 and HG3, respectively. The other high-voltage generation circuits not shown in FIG. 5 may also be configured identically to the first high-voltage generation circuit HVGEN1.

Figure 6:
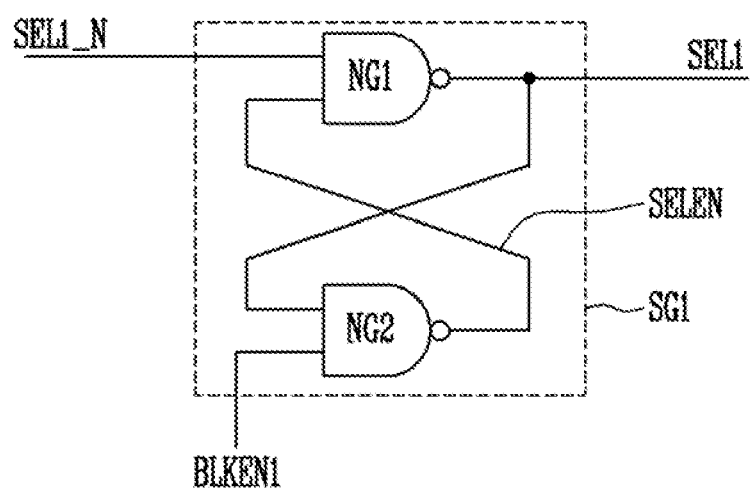
FIG. 6 is a diagram illustrating a select signal output unit, according to an embodiment of the present disclosure.

FIG. 6 is a diagram illustrating a select signal output unit, according to an embodiment of the present disclosure. For example, a select signal output unit of FIG. 6 may be the first select signal output unit SG1 of FIG. 5. Since the first to third select signal output units SG1 to SG3 of FIG. 5 are configured identically to one another, the first select signal output unit SG1 will be described as an example.

Referring to FIG. 6, the first select signal output unit SG1 may be configured as an SR flip-flop. For example, the first select signal output unit 5G1 may include a first and a second NAND gates NG1, NG2. In the example shown, it assumed that input terminals of the first NAND gate NG1 are first and second input terminals, an output terminal of the first NAND gate NG1 is a first output terminal, input terminals of the second NAND gate NG2 are third and fourth input terminals and an output terminal of the second NAND gate NG2 is a second output terminal. A signal SELEN output from the second NAND gate NG2 may be applied to the second input terminal of the first NAND gate NG1, and a first select signal SEL1 output from the first NAND gate NG1 may be applied to the third input terminal of the second NAND gate NG2. If a first pre select signal SEL1_N is applied to the first input terminal of the first NAND gate NG1, a first multi-enable signal BLKEN1 may be applied to the fourth input terminal of the second NAND gate NG2. Because of the characteristics of the SR flip-flop, after the first NAND gate NG1 outputs a first select signal SEL1 of '1,' the first select signal SEL1 can be maintained as '1' even though the signal applied to the first input terminal of the first NAND gate NG1 is changed, Operations of selecting a plurality of memory blocks will be described in detail with reference to FIGS. 5 and 6 and Tables 1 and 2.

TABLE 1

| # | SEL#_N | BLKEN# | SEL# | HV# |
|---|--------|--------|------|-----|
| 3 | 1 | 1 | 0 | — |
| 2 | 1 | 1 | 0 | — |
| 1 | 0 | 1 | 1 | HV1 |

Referring to Table 1, when multiple memory blocks are selected, all the first to third block enable signals BLKEN1 to BLKEN3 become '1.' If the first pre select signal SEL1_N is output as '0' response to the first row address RADD1 the first select signal SEL1 is output as '1.' If the first select signal SEL1 is output as '1,' the first high-voltage output unit HG1 outputs a first high voltage HVA, in response to the first select signal SEL1 and the first pass circuit HVPASS1 is activated so that the global lines GL and the first local lines LL1 are connected to each other. Thus, the first memory block connected to the first local lines LL1 is selected.

In this case, the second decoder DEC2 may output a second pre select signal SEL2_N of '1' in response to a second row address RADD2, and the second select signal output unit SG2 may output a second select signal SLE2 of '0' If the second select signal SLE2 is '0,' the second high-voltage output unit HG2 does not output a second high voltage HV2 in response to the second select signal SEL2 and the second pass circuit HVPASS2 is not-activated, and therefore, the global lines GL and the second local lines LL2 are not connected to each other.

The third decoder DEC3 may also output a third pre select signal SEL3_N of T in response to a third row address RADD3, and the third select signal output unit SG3 may output a third select signal SEL3 of '0.' If the third select signal SEL3 is '0,' the third high-voltage output unit HG3 does not output a third high voltage HV3 in response to the third select signal SEL3, the third pass circuit HVPASS3 is not-activated, and therefore, the global lines GL and the third local lines LL3 are not connected to each other.

After the first memory block is selected, first to third row addresses RADD1 to RADD3 for selecting the second memory block may be entered as new input to the first to third decoders DEC1 to DEC3. This will be described in detail with reference to the following 'Table 2.'

TABLE 2

| # | SEL#_N | BLKEN# | SEL# | HV# |
|---|--------|--------|------|-----|
| 3 | 1 | 1 | 0 | — |
| 2 | 0 | 1 | 1 | — |
| 1 | 1 | 1 | 1 (Maintenance) | HV1 (Maintenance) |

Referring to Table 2, in response to the new input of the first to third row addresses RADD1 to RADD3, the first pre select signal SEL1_N may become '1,' the second pre select signal SEL2_N may become '0,' and the third pre select signal SEL3_N may become '1.' That is, the first pre select signal SEL1_N is changed from '0' to '1,' the second pre select signal SEL2_N is changed from '1' to '0,' and the third pre select signal SEL3_N remains '1.' Because of the characteristics of the SR flip-flop, although the first pre select signal SEL1_N is changed from '0' to '1,' the first select signal SEL1 output from the first select signal output unit SG1 is maintained as '1,' that is, it maintains its previous value. Thus, the first high voltage HV1 continues to be the output, and accordingly, the first memory block may be maintained as a selected memory block.

If the second pre select signal SEL2_N is changed from '1' to '0,' the second select signal SEL2 is changed from '0' to '1'. If the second select signal SEL2 is '1,' the second high-voltage output unit HG2 outputs a second high voltage HV2 in response to the second select signal SEL2. If the second high voltage HV2 is the output, the second pass circuit HVPASS2 is activated so that the global lines GL and the second local lines LL2 are connected to each, other. Thus, the second memory block connected to the second local lines LL2 may be selected.

If the third pre select signal SEL3_N remains '1,' the third select signal output unit SG3 may output the third select signal SEL3 of '0.' If the output of the third select signal SEL3 is '0,' then the third high-voltage output unit HG3 does not output a third high voltage HV3 in response to the third select signal SEL3 and third pass circuit HVPASS3 is not-activated. Therefore, the global lines GL and the third local lines LL3 do not become connected to each other.

Accordingly, if both the first and second high voltages HV1 and HV2 are generated, then both the first and second memory blocks can be selected.

In the above-described embodiment, an operation of selecting the first and second memory blocks has been described. However, three or more memory blocks may be selected based on the aforementioned description.

Figure 7:
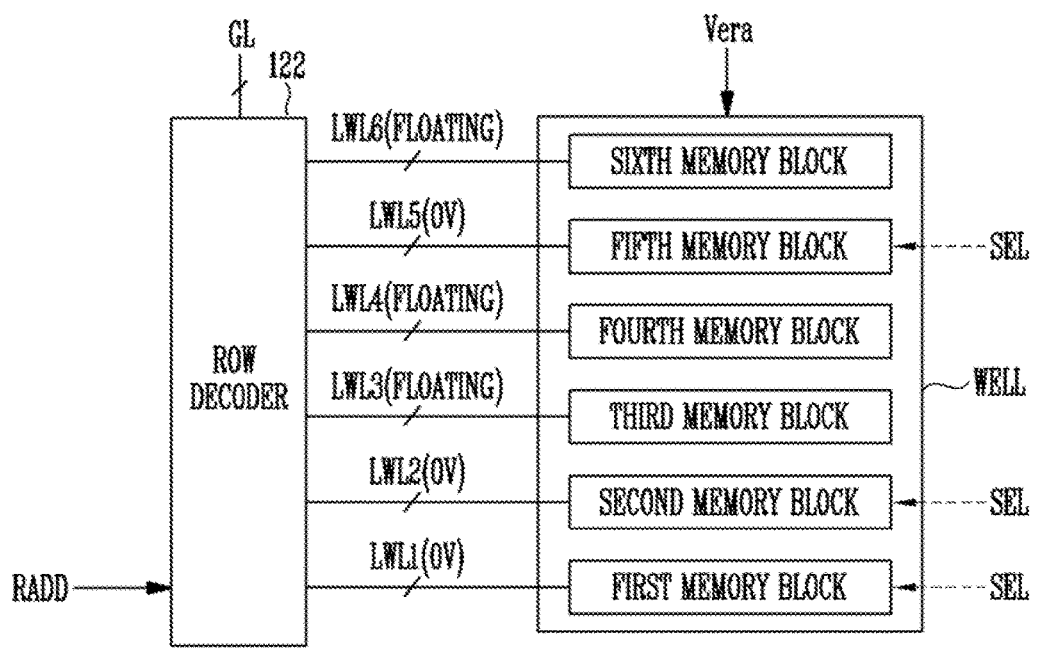
FIG. 7 is a diagram illustrating an erase operation, according to an embodiment of the present disclosure.

Referring now to FIG. 7 an erase operation is described, according to an embodiment of the present disclosure. For example, the erase operation of FIG. 7 may be an erase operation in which multiple memory blocks are selected. The erase operation may be performed by the row decoder 122 in FIG. 4.

Referring to FIG. 7, if multiple memory blocks are selected, the selected memory blocks may be erased simultaneously. For example, in the embodiment illustrated, it is assumed that first to sixth memory blocks share one well with one another. It is also assumed that the first, second, and fifth memory blocks are selected memory blocks SEL to be erased. In order to erase the memory cells included in the first, second, and fifth memory blocks simultaneously, first, second, and fifth local word lines LWL1, LWL2, and LWL5 connected to the first, second, and fifth memory blocks may be grounded to 0V, and third, fourth, and sixth local word lines LWL3, LWL4, and LWL6 connected to the other unselected third, fourth, and sixth memory blocks may be floated, while the erase voltage Vera from the voltage generation circuit 121 of FIG. 2 is applied to the well.

Figure 8:
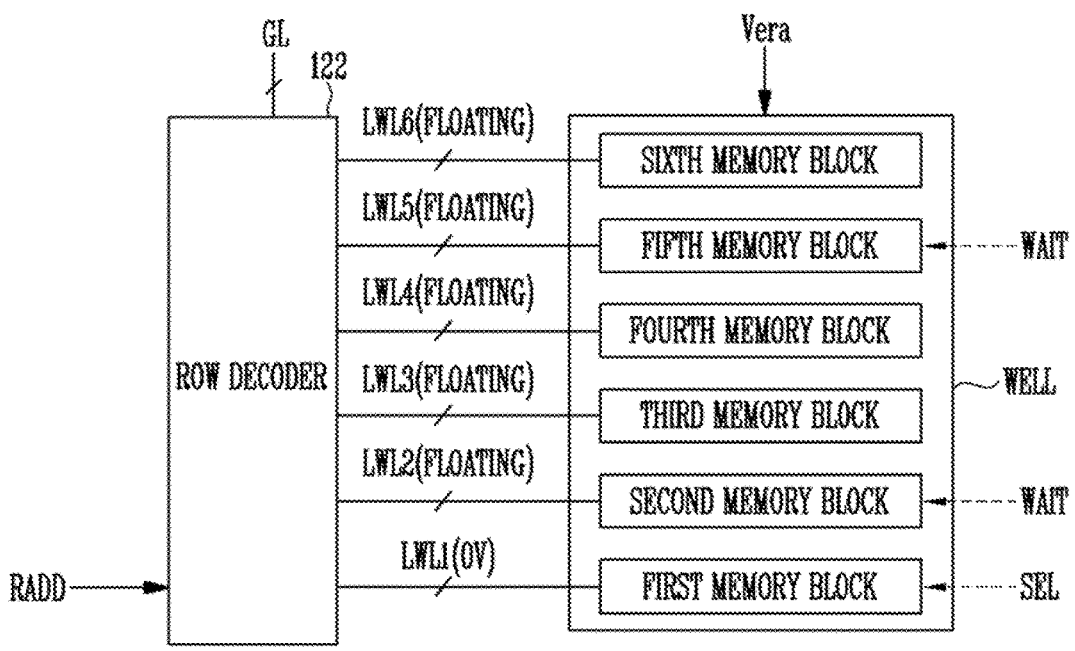
FIG. 8 is a diagram illustrating an erase operation, according to another embodiment of the present disclosure.

Referring now to FIG. 8 an erase operation is illustrated, according to an embodiment of the present disclosure. For example, the erase operation of FIG. 8 may be an erase operation in which a single memory block is selected. The erase operation may be performed by the row decoder 122 in FIG. 4.

Referring to FIG. 8, when a single memory block is selected, all the block enable signals (BLKEN1 to BLKEN3 of FIG. 5) are low and therefore one memory block may be selected according to a row address. A case where the first memory block is a selected memory block SEL will be described as an example. When the other second and fifth memory blocks are memory blocks WAIT under waiting, the second and fifth memory blocks WAIT under waiting operate identically to the unselected memory blocks while a erase operation is being performed. For example, while the erase voltage Vera from the voltage generation circuit 121 of FIG. 2 may be applied to the well, the first local word lines LWL1 connected to the selected first memory block SEL are grounded to 0V, and the second and fifth local word lines LWL2 to LWL5 respectively connected to the second and fifth memory blocks WAIT under waiting and the other unselected third, fourth, and sixth memory blocks are floated.

If the single erase operation of the first memory block is completed, one of the second and fifth memory blocks WAIT under waiting, is selected so that the single erase operation is performed.

As described above, when multiple memory blocks are to be erased, at least a portion of a multi-erase operation and a portion of a single erase operation may be performed together, so that it may become possible to reduce the overall operation time and may also improve the reliability of the erase operation.

Figure 9:
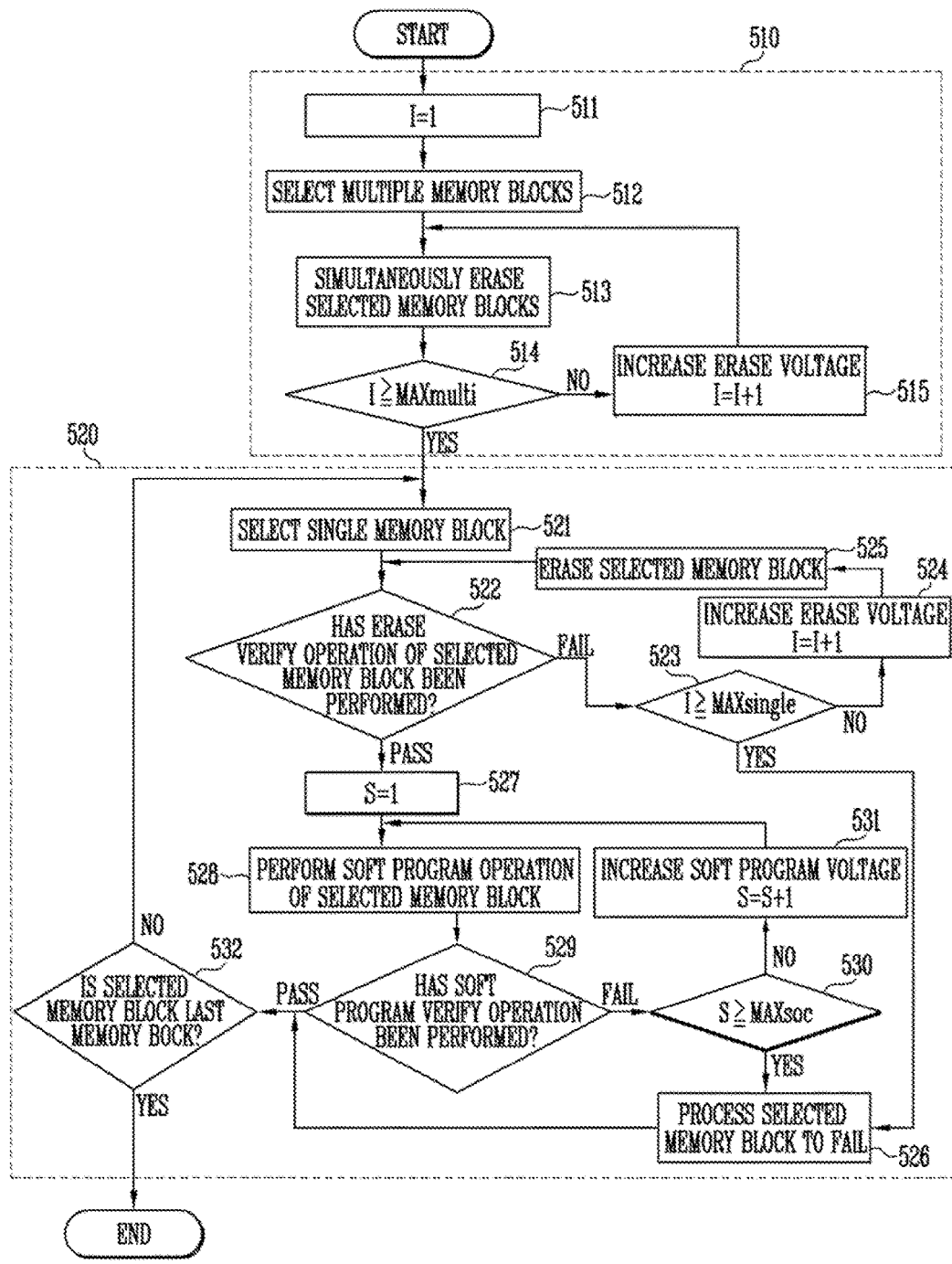
FIG. 9 is a flowchart illustrating a multi-erase operation, according to an embodiment of the present disclosure.

Referring now to FIG. 9 the steps of a multi-erase operation are provided, according to an embodiment of the present disclosure. For example, the multi-erase operation may be performed in the storage device 1110 of FIG. 2. Accordingly, in a multi-erase operation according to an embodiment of the present disclosure a multi-erase operation or a single erase operation is performed according to a loop frequency of an erase operation.

In a multi-erase section 510, threshold voltages of memory cells included in memory blocks to be erased may be rapidly decreased at the same time. In a single erase section 520, threshold voltages of memory cells included in each of the memory blocks to be erased may be slowly decreased. To this end, in the multi-erase section 510, multiple memory blocks may be simultaneously erased without verification. In the single erase section 520, memory blocks selected in the multi-erase section 510 may be erased one by one and subjected to erase verification. The multi-erase section 510 and the single erase section 520 will be described in detail as follows.

If a multi-erase operation is started, the multi-erase operation 510 may be performed first, followed by the single erase section 520.

If the multi-erase section 510 is started, an erase loop frequency I (wherein I is a positive integer) is set to 1 (511), and multiple memory blocks to be erased are selected (512). The multiple memory blocks may be selected by the row decoder 122 of FIG. 4, and the word lines of the selected memory blocks may be grounded to 0V. The word lines of the remaining unselected memory blocks may be floated. An erase voltage Vera may be applied to a well shared by the selected memory blocks, so that the selected memory blocks may be imultaneously erased (513) That s, in the mufti-erase section 510, only a gradually increased erase voltage may be applied to the well without any verification operation.

Subsequently, it may be determined whether the erase loop frequency I has reached a maximum multi-loop frequency MAXmulti (514). In an embodiment, the maximum multi-loop frequency MAXmulti may be set in a test erase operation of the memory device. For example, the maximum multi-loop frequency MAXmulti may be set by the following method. In a test erase operation, an erase target level may have a negative level and therefore, an arbitrary level higher than the erase target level may be set. Subsequently, a frequency at which a gradually increasing erase voltage is applied to the well may be counted while the erase voltage is applied to the well. A frequency at which threshold voltages of memory cells are decreased to the arbitrary set level may be set as the maximum multi-loop frequency MAXmulti. In addition the maximum multi-loop frequency MAXmulti may be set by various methods according to the characteristics of the memory device.

If the erase loop frequency I is less than the maximum multi-loop frequency MAXmulti (No), the erase loop frequency I may be increased by 1 for the next erase loop operation, and the erase voltage Vera may be increased by a first step voltage (515). In this manner, a multi-erase loop (513 to 515) may be repeated.

Then, if the erase loop frequency I reaches the maximum multi-loop frequency MAXmulti (514, Yes), the single erase section 520 may be performed.

If the single erase section 520 is started, one memory block is selected (521) among the multiple selected memory blocks in the multi-erase section 510 is selected. An erase verification operation of the selected memory block may then be performed (522). In the erase verification operation, it may be determined whether threshold voltages of memory cells included in the selected memory block are decreased to an erase target level. If the threshold voltages of the memory cells included in the selected memory block are not decreased to the erase target level, the erase verification operation is considered a fail. If the threshold voltages of the memory cells included in the selected memory block are decreased to the erase target level, the erase verification operation is considered a pass.

If the erase verification operation fails (522, fail), it may then be determined whether the erase loop frequency I has reached a maximum single loop frequency MAXsingle (523). In an embodiment, the maximum single loop frequency MAXsingle may be a frequency set to prevent the single erase section 520 from being infinitely performed. If the erase loop frequency I is less than the maximum single loop frequency MAXsingle (523, No), the erase loop frequency I may be increased by 1 for the purpose of the next erase loop, and the erase voltage Vera may also be increased (524). Subsequently, the selected memory block may be erased by using the increased erase voltage (525). The erase voltage may be increased by a first: step voltage of the multi-erase section 510 or increased by a second step voltage lower than the first step voltage. When the second step voltage is used, the variation in the threshold voltages of the memory cells may be decreased and may be possible to narrow the width of the threshold voltage distribution of the memory cells.

Hence, a single erase loop (522 to 525) may be repeated. If the erase loop frequency I reaches the maximum single loop frequency MAXsingle before the erase verification operation (522) is a pass (Yes in step 523), the selected memory block is considered to be a failed memory block (526).

If the erase verification operation passes (522, pass) before the erase loop frequency I reaches the maximum single loop frequency MAXsingle, a soft program operation for narrowing the threshold voltage distribution of memory cells may be performed.

An example of soft program operation is described in detail as follows. A soft program loop frequency S may be set to 1 (527), and a soft program operation of a selected memory block may be performed (528). The soft program operation may be performed by employing an incremental step pulse program (ISPE) method in which a soft program voltage may be gradually increased. Subsequently, a soft program verification operation may be performed (529). Since the soft program operation may be performed to narrow the threshold voltage distribution of memory cells included in the selected memory block, a soft program target level used in the soft program verify operation may be set to a level lower than 0V, The soft program operation may be performed simultaneously on all the memory cells included in the selected memory block. For example, in step 529, the threshold voltages of the memory cells may be increased by applying simultaneously the soft program voltage to local word lines connected to the selected memory block.

Subsequently, the soft program verify operation of the selected memory block may be performed (529) The soft program verify operation may be simultaneously performed on all memory cells. For example, after a verify voltage is applied to the local word fines connected to the selected memory block a voltage or current may be measured through bit lines. If it is determined that the threshold voltage of at least one memory cell in a string is increased as compared with the soft program target level by the measured voltage or current, the soft program verify operation (529) is considered a pass. If it is determined in step 529 that there is no memory cell having an increased threshold voltage as compared with the soft program target level, the soft program verify operation (529) fails.

If the soft program verify operation fails, it is determined that the soft program loop frequency S is equal to or greater than a maximum soft program loop frequency MAXsoc (530). If the soft program loop frequency S is less than the maximum soft program loop frequency MAXsoc (530, No), the soft program loop frequency S may be increased by 1 for the purpose of the next soft program loop, and the soft program voltage may be increased (531). Subsequently, the soft program operation of the selected memory block may be repeated (528).

In this manner, a soft program loop (528 to 531) may be repeated. Then, if the soft program loop frequency S reaches the maximum soft program loop frequency MAXsoc before the soft program verify operation (529) passes (Yes in step 530), the selected memory block may be processed to fail (526).

If the soft program verify operation (529) passes before the soft program loop frequency S reaches the maximum soft program loop frequency MAXsoc, it is determined whether the selected memory block is the last memory block among the memory blocks to be erased (532).

If the selected memory block is not the last memory block among the memory blocks to be erased (No), a next memory block may be selected (521), and the above-described steps 521 to 532 may be repeated.

In step 532, if it is determined that the selected memory block is the last memory block among the memory blocks to be erased (Yes), the multi-erase operation is ended.

Figure 10:
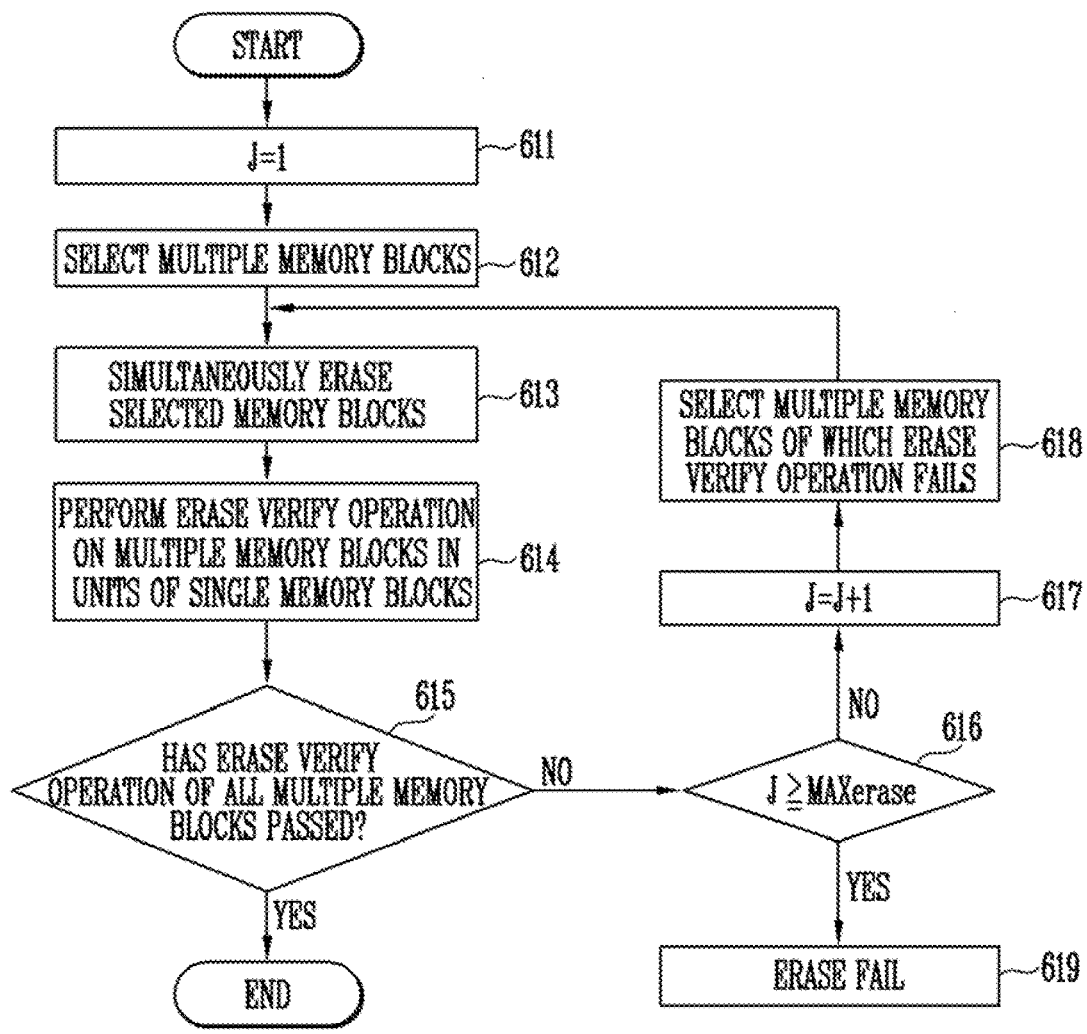
FIG. 10 is a flowchart illustrating a multi-erase operation, according to another embodiment of the present disclosure.

FIG. 10 is a flowchart illustrating a multi-erase operation according to another embodiment of the present disclosure. For example, the multi-erase operation may be performed in the storage device 1110 of FIG. 2.

Referring to FIG. 10, a multi-erase operation and a single erase operation may be performed based on a result of an erase verification operation. That, is, an erase operation may be performed in more than one memory blocks simultaneously, whereas an: erase verification operation may be performed on a single memory blocks at a time. This will be described in detail as follows.

If the multi-erase operation is started, an erase loop frequency J (J is a positive integer) may be set to 1 (611), and multiple memory blocks to be erased are selected (612). The multiple memory blocks may be selected by the row decoder 122 of FIG. 4, and word lines of the selected memory blocks may be grounded to 0V. Word lines of the other unselected memory blocks may be floated. An erase voltage may be applied to a well shared by the selected memory blocks, so that the selected memory blocks may be erased simultaneously (613).

After the erase voltage is applied to the well, an erase verification operation may be performed for determining whether an erase operation of memory blocks has been completed (614). The erase verification operation may be performed on a single memory block each time. For example, the erase verification operation may be performed by selecting one by one each memory block form the plurality of memory blocks which are subjected to the erase operation. The result of an erase verification operation of each of the single memory blocks may be arbitrarily stored in a register included in the storage device 1110. For example, information on a result of an erase verification operation for a single memory block may include an address of the memory block of which the erase verification operation fails, Subsequently, it may be determined whether the erase verification operation of all the multiple memory blocks has passed based on the erase verification operation results (615). According to the address of the memory blocks for which the erase verification operation fails, it may be determined whether the erase verification operation of all the multiple memory blocks has passed. For example, if an address of the memory blocks for which the erase verification operation fails is not stored in the register, it may be determined that the erase verification operation of all the selected memory blocks has passed, and therefore, the multi-erase operation is ended. If an address of the memory blocks for which the erase verification operation fails is stored in the register, it may be determined that the erase verification operation of at least one memory block among the selected memory blocks has failed.

If the memory block for which an erase verification operation fail is detected, it may be determined whether the erase loop frequency 3 has reached a maximum erase loop frequency MAXerase (616). If the erase loop frequency 3 is equal to or greater than the maximum erase loop frequency MAXerase (616, Yes), the erase operation may be processed to fail (619) so as to prevent an erase loop from being infinitely repeated. If the erase loop frequency 3 is smaller than the maximum erase loop frequency MAXerase (616, No), the erase loop frequency 3 may be increased by 1 for the purpose of a next erase loop (617), and memory blocks for which an erase verification operation fails may be selected (618). In this manner, the selected memory blocks in the multi-erase operation may be erased simultaneously, and the erase verification operation may be performed in units of single memory blocks.

Figure 11:
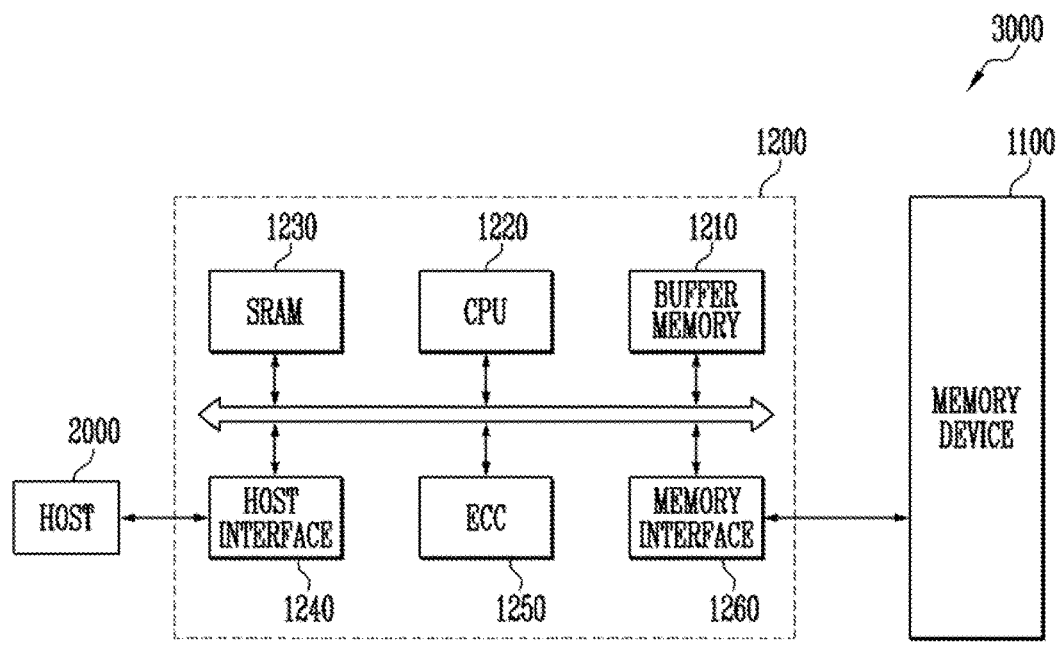
FIG. 11 is a diagram illustrating a memory system according, to an embodiment of the present disclosure.

Referring to FIG. 11, a memory system, according to an embodiment of the present disclosure, is provided. For example, the memory system of FIG. 11 may be the memory system of FIG. 1. The memory system 3000 may include a memory device 1100 for storing data and a memory controller 1200 for controlling the memory device 1100. Also, the memory controller 1200 may control communication between a host 2000 and the memory device 1100. The memory controller 1200 may include a buffer memory 1210 a central processing unit (CPU) 1220, a static random access memory (SRAM) 1230, a host interface 1240, an error correction code (ECC) unit 1250, and a memory interface 1260.

The buffer memory 1210 may store data temporarily while the memory controller 1200 may control the memory device 1100. The CPU 1220 may perform a control operation for data exchange of the memory controller 1200. The SRAM 1230 may be used as a working memory of the CPU 1220. The host interface 1240 may be provided with a data exchange protocol of the host 2000 coupled to the memory system 3000. The ECC unit 1250 may detect and correct errors included in data read out from the memory device 1100. The memory interface 1260 may interface with the memory device 1100. Although not shown in FIG. 11, the memory system 3000 may further include a read only memory (ROM) not shown) for storing code data for interfacing with the host 2000.

The host 2000 for which the memory system 3000 available may include e computer, a ultra-mobile PC (UMPC), workstation, a net-book, a personal digital assistant (PDA), a portable computer, a web tablet, a wireless phone, a mobile phone, a smart phone, a digital camera, a digital audio recorder, a digital audio player, a digital video recorder, a digital video player, a device capable of transmitting/receiving information in a wireless environment, one of various electronic devices that constitute a home network, and/or the like.

Figure 12:
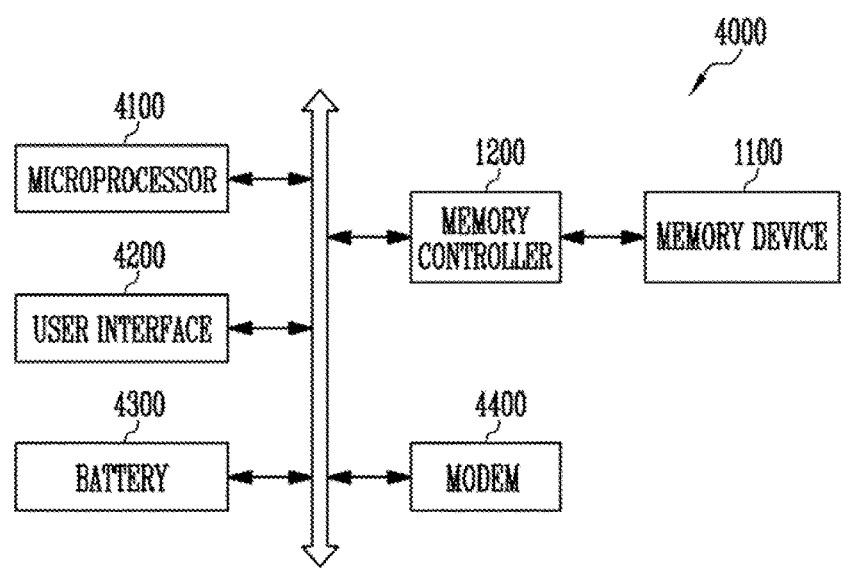
FIG. 12 is a diagram illustrating a computing system including a memory system, according to an embodiment of the present disclosure.

FIG. 12 is a diagram illustrating a computing system including a memory system according to an embodiment of the present disclosure. For example, the computing system of FIG. 12 may include the memory system of FIG. 1.

Referring to FIG. 12, the computing system 4000 may include a memory device 1110, a memory controller 1200, a microprocessor 4100, a user interface 4200, and a modem 4400, which are electrically coupled to a bus. When the computing system 4000 is a mobile device, a battery 4300 for supplying operation voltages of the computing system 4000 may be additionally provided in the computing system 4000. Although not shown in this figure, the computing system 4000 may further include an application chip set, a camera image processor (CIS), a mobile dynamic random access memory (DRAM), and the like. The memory controller 1200 and the memory device 1110 may constitute a solid state drive/disk (SSD).

The computing system 4000 may be packaged in various forms. For example, the computing system 4000 may be packaged in a manner such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi-chip package (MCP), wafer-level fabricated package (WFP), or wafer-level processed stack package (WSP).

According to the present disclosure, when an erase operation is performed, a plurality of memory blocks may be erased simultaneously, thereby improving an erase operation speed. Accordingly, it is possible to enhance the speed performance of storage devices and of a memory device including the same.

Example embodiments have been disclosed herein, and although specific terms are employed, they are used and are to be interpreted in a generic and descriptive sense only and not for the purpose of limiting the invention. Moreover, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:
1. A storage device comprising:
a plurality of memory blocks suitable for storing data;
a peripheral circuit suitable for selecting multiple memory blocks from among the plurality of memory blocks and for performing simultaneously an erase operation on the selected multiple memory blocks, wherein the erase operation is performed by repeating erase loops; and
a control circuit suitable for controlling the peripheral circuit to simultaneously erase the multiple memory blocks, and perform a single erase operation and an erase verification operation on the multiple memory blocks respectively if a frequency of the erase loop reaches a maximum multi-loop frequency.
2. The storage device of claim 1, wherein the peripheral circuit includes:
a voltage generation circuit suitable for generating operation voltages having various levels in response to an operation signal;
a row decoder suitable for selecting simultaneously one or more memory blocks among the plurality of memory blocks in response to a row address, and for providing the operation voltages to the selected one or more memory blocks;
a page buffer suitable for transmitting data to and/or receiving data from the memory blocks in response to a page buffer control signal;

a column decoder suitable for transmitting data to and/or receiving data from the page buffer in response to a column address; and an input/output circuit suitable for transmitting to the control circuit, a command and an address received from an external device, and/or for transmitting to the column decoder data received from the external device.

3. The storage device of claim 2, wherein the row decoder includes:
decoders suitable for outputting pre select signals in response to the row address;
select signal output units suitable for outputting selected signals in response to pre select signals and block enable signals;
high-voltage output units suitable for outputting high voltages in response to the select signals; and
pass circuits suitable for providing the operation voltages to the selected memory block or the multiple memory blocks in response to the high voltages.

4. The storage device of claim 3, wherein the select signal output units include SR flip-flops suitable for operating in response to the pre select signals and the block enable signals,
wherein the SR flip-flops include:
first NAND gates suitable for outputting the pre select signals in response to the pre select signals and first signals; and
second NAND gates suitable for outputting the first signals in response to the pre select signals and the block enable signals.

5. The storage device of claim 1, wherein in the erase operation the control circuit controls the peripheral circuit to perform a multi-erase session where the multiple memory blocks are simultaneously erased, and then perform a single erase session where the multiple memory blocks are sequentially subjected one by one to the erase operation and the erase verification operation, or
wherein in the erase operation the control circuit controls the peripheral circuit to perform the multi-erase session where the multiple memory blocks are simultaneously erased, and perform the erase verification operation in units of single memory blocks.

6. The storage device of claim 5, wherein the control circuit includes a register suitable for storing information on an erase verification operation result of the multiple memory blocks.

7. The storage device of claim 6, wherein the control circuit controls the peripheral circuit so that memory blocks on which the erase operation is to be performed are selected by changing the row address, based on the information on the erase verification operation result.

8. A memory system comprising:
a memory device including storage devices for performing a multi-erase operation, wherein the multi-erase operation is performed by performing a multi-erase section where an erase loop is repeated so that multiple memory blocks selected from among a plurality of memory blocks are simultaneously erased, and the memory device performs a single erase operation and an erase verification operation on the multiple memory blocks respectively if a frequency of the erase loop reaches a maximum multi-loop frequency; and
a memory controller suitable for controlling the memory device in response to a command received from a host.

9. The memory system of claim 8, wherein, in the multi-erase operation, the storage devices perform a multi-erase section and then perform a single erase section, or wherein, in the multi-erase operation, the storage devices erase multiple memory blocks, and perform an erase verification operation in units of single memory blocks.

10. The memory system of claim 9, wherein in the multi-erase operation the storage devices apply a gradually increased erase voltage to a well shared by memory blocks to be erased, ground local word lines connected to the memory blocks to be erased, and float local word lines connected to the other memory blocks except the memory blocks to be erased.

11. The memory system of claim 9, wherein when the multi-erase session is first performed followed by a single erase session, the storage devices do not perform the erase verification operation when the multi-erase session is performed.

12. The memory system of claim 9, wherein when the single erase section is performed the storage devices perform one by one an erase operation and an erase verification operation on memory blocks to be erased among a plurality of memory blocks included therein.

13. The memory system of claim 9, wherein when the multiple memory blocks are simultaneously erased and the erase verification operation is performed in units of single memory blocks, the storage devices newly select memory blocks determined as memory blocks for which erase verification operation fails, and perform the multi-erase operation on the newly selected memory blacks when a next multi-erase loop is performed.

14. A method of operating a storage device, the method comprising:
performing a multi-erase section where an erase loop is repeated so that multiple memory blocks selected from among a plurality of memory blocks are simultaneously erased; and
if a frequency of the erase loop reaches a maximum multi-loop frequency, performing a single erase section so that the multiple memory blocks are subjected one by one to an erase operation and an erase verification operation.

15. The method of claim 14, wherein the multi-erase session repeats:
grounding local word lines connected to the multiple memory blocks;
applying an erase voltage to a well shared by the multiple memory blocks;
determining whether the frequency of the erase loop has reached the maximum multi-loop frequency; and
until the frequency of the erase loop reaches the maximum multi-loop frequency, increasing the frequency of the erase loop, and simultaneously erasing the multiple memory blocks while increasing the erase voltage by a first step voltage.

16. The method of claim 15, further comprising floating local word lines connected to the other memory blocks, when the local word lines connected to the multiple memory blocks are grounded.

17. The method of claim 15, wherein the maximum multi-loop frequency is set as a frequency when threshold voltages of memory cells to be subjected to a test erase operation are decreased to an arbitrary level.

18. The method of claim 17, wherein the arbitrary level is higher than an erase target level.

19. The method of claim 14, wherein the single erase session includes:
selecting one memory block among the multiple memory blocks;

performing an erase verification operation of the selected memory block;

repeating erasing of the selected memory block while increasing the erase voltage by a second step until the erase verification operation passes; and if the erase verification operation passes, performing a soft program operation of the selected memory block, wherein the single erase section is performed on each of the other memory blocks among the multiple memory blocks, if the soft program operation of the selected memory block is completed.

20. The method of claim 19, further comprising:

if the erase verification operation fails, determining whether the frequency of the erase loop has reached a maximum single loop frequency; and if the frequency of the erase loop reaches the maximum single loop frequency, processing the selected memory block to fail and if the frequency of the erase loop is lower than the maximum single loop frequency, increasing the erase voltage.

* * * * *